US012662750B2

(12) United States Patent
    Lin

(10) Patent No.: US 12,662,750 B2
(45) Date of Patent: Jun. 23, 2026

(54) METHOD OF MANUFACTURING SILICON CARBIDE SEED CRYSTAL AND METHOD OF MANUFACTURING SILICON CARBIDE INGOT

(71) Applicant: GlobalWafers Co., Ltd., Hsinchu (TW)

(72) Inventor: Ching-Shan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 974 days.

(21) Appl. No.: 17/895,050

(22) Filed: Aug. 24, 2022

(65) Prior Publication Data

US 2022/0403546 A1     Dec. 22, 2022

Related U.S. Application Data

(62) Division of application No. 17/385,925, filed on Jul. 27, 2021, now Pat. No. 11,781,241.

(60) Provisional application No. 63/056,729, filed on Jul. 27, 2020, provisional application No. 63/056,728, filed on Jul. 27, 2020.

(51) Int. Cl.
    *C30B 23/02*      (2006.01)
    *C30B 23/06*      (2006.01)
    *C30B 29/36*      (2006.01)
    *C01B 32/956*     (2017.01)
    *H10D 62/50*      (2025.01)

(52) U.S. Cl.
    CPC .......... *C30B 23/025* (2013.01); *C30B 23/066* (2013.01); *C30B 29/36* (2013.01); *C01B 32/956* (2017.08); *H10D 62/50* (2025.01)

(58) Field of Classification Search
    None
    See application file for complete search history.

(56) References Cited

U.S. PATENT DOCUMENTS

| 6,348,095 | B1 | 2/2002 | Watanabe et al. | |
| 2009/0205565 | A1 | 8/2009 | Nakabayashi et al. | |
| 2013/0280466 | A1* | 10/2013 | Zwieback | B28D 5/00 |
| | | | | 428/64.1 |

(Continued)

FOREIGN PATENT DOCUMENTS

| CN | 104790026 | 7/2015 |
| CN | 105358744 | 2/2016 |

(Continued)

OTHER PUBLICATIONS

Shi; Yonggui et al., "Thermal Stress Analysis of Crystal Morphology in Growth of Silicon Carbide Bulk Crystal by PVT Method", Journal of Xi'an Jiaotong University, with English abstract, Jan. 2011, pp. 117-121, vol. 45, No. 1.

(Continued)

*Primary Examiner* — Guinever S Gregorio

(74) *Attorney, Agent, or Firm* — JCIPRNET

(57) ABSTRACT

A method of manufacturing silicon carbide seed crystal and method of manufacturing silicon carbide ingot are provided. The silicon carbide seed crystal has a silicon surface and a carbon surface opposite to the silicon surface. A difference D between a basal plane dislocation density BPD1 of the silicon surface BPD1 and a basal plane dislocation density BPD2 of the carbon surface satisfies the following formula (1):

$$D=(BPD1-BPD2)/BPD1 \leq 25\%　　　　(1).$$

4 Claims, 6 Drawing Sheets

(56)            References Cited

U.S. PATENT DOCUMENTS

| | | | | |
|---|---|---|---|---|
| 2016/0020284 | A1* | 1/2016 | D'Evelyn | C30B 25/18 |
| | | | | 428/64.1 |
| 2016/0215414 | A1* | 7/2016 | Nakabayashi | C30B 23/063 |
| 2025/0223723 | A1* | 7/2025 | Lin | B24B 5/50 |

FOREIGN PATENT DOCUMENTS

| | | |
|---|---|---|
| CN | 105420812 | 3/2016 |
| CN | 105658846 | 6/2016 |
| CN | 106103815 | 11/2016 |
| CN | 109628999 | 4/2019 |
| CN | 110268106 | 9/2019 |
| CN | 110359087 | 10/2019 |
| WO | 2019244580 | 12/2019 |

OTHER PUBLICATIONS

"Office Action of China Counterpart Application", issued on Jan. 10, 2024, p. 1-p. 9.

* cited by examiner

10C(BPD2)

10Si(BPD1)

10

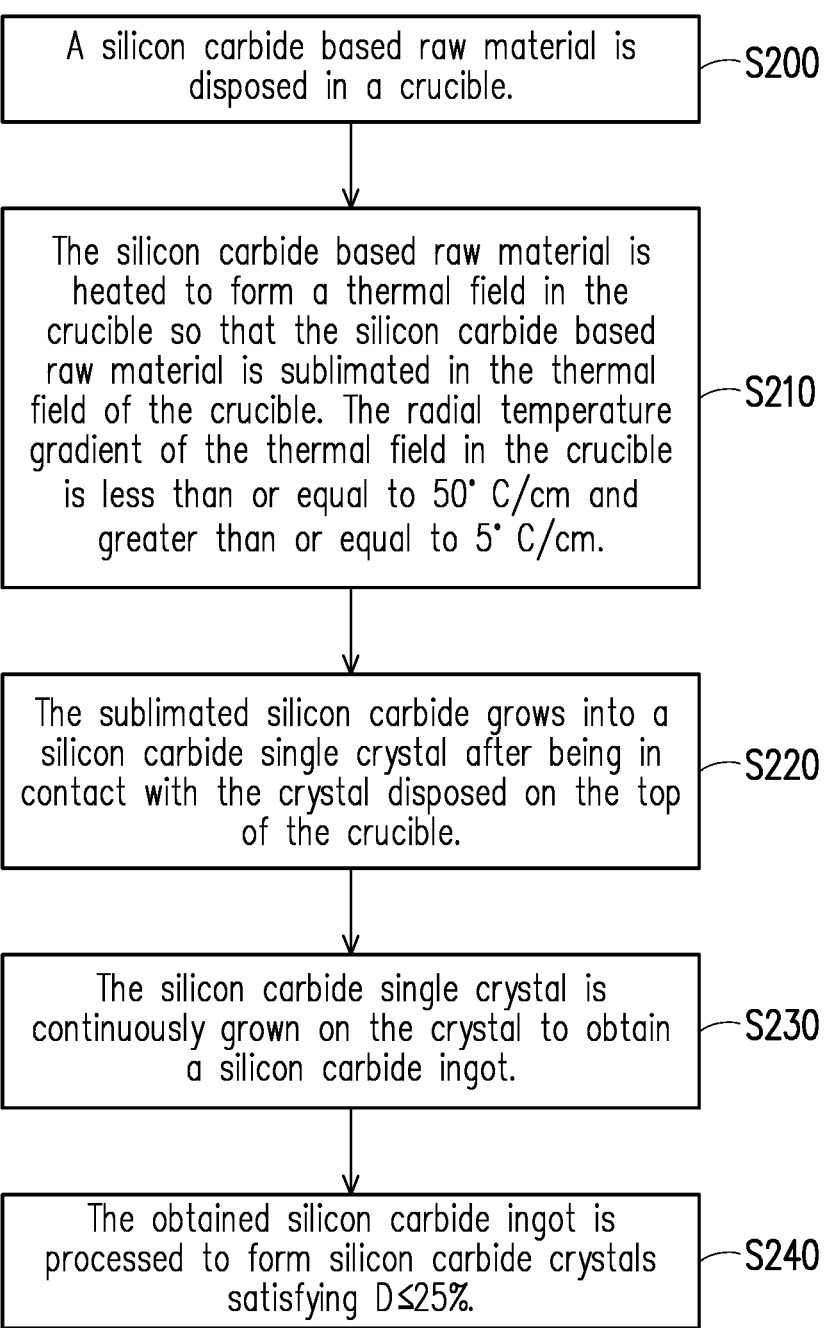

A silicon carbide based raw material is disposed in a crucible. ⟶ S200

The silicon carbide based raw material is heated to form a thermal field in the crucible so that the silicon carbide based raw material is sublimated in the thermal field of the crucible. The radial temperature gradient of the thermal field in the crucible is less than or equal to 50° C/cm and greater than or equal to 5° C/cm. ⟶ S210

The sublimated silicon carbide grows into a silicon carbide single crystal after being in contact with the crystal disposed on the top of the crucible. ⟶ S220

The silicon carbide single crystal is continuously grown on the crystal to obtain a silicon carbide ingot. ⟶ S230

The obtained silicon carbide ingot is processed to form silicon carbide crystals satisfying D≤25%. ⟶ S240

FIG. 2

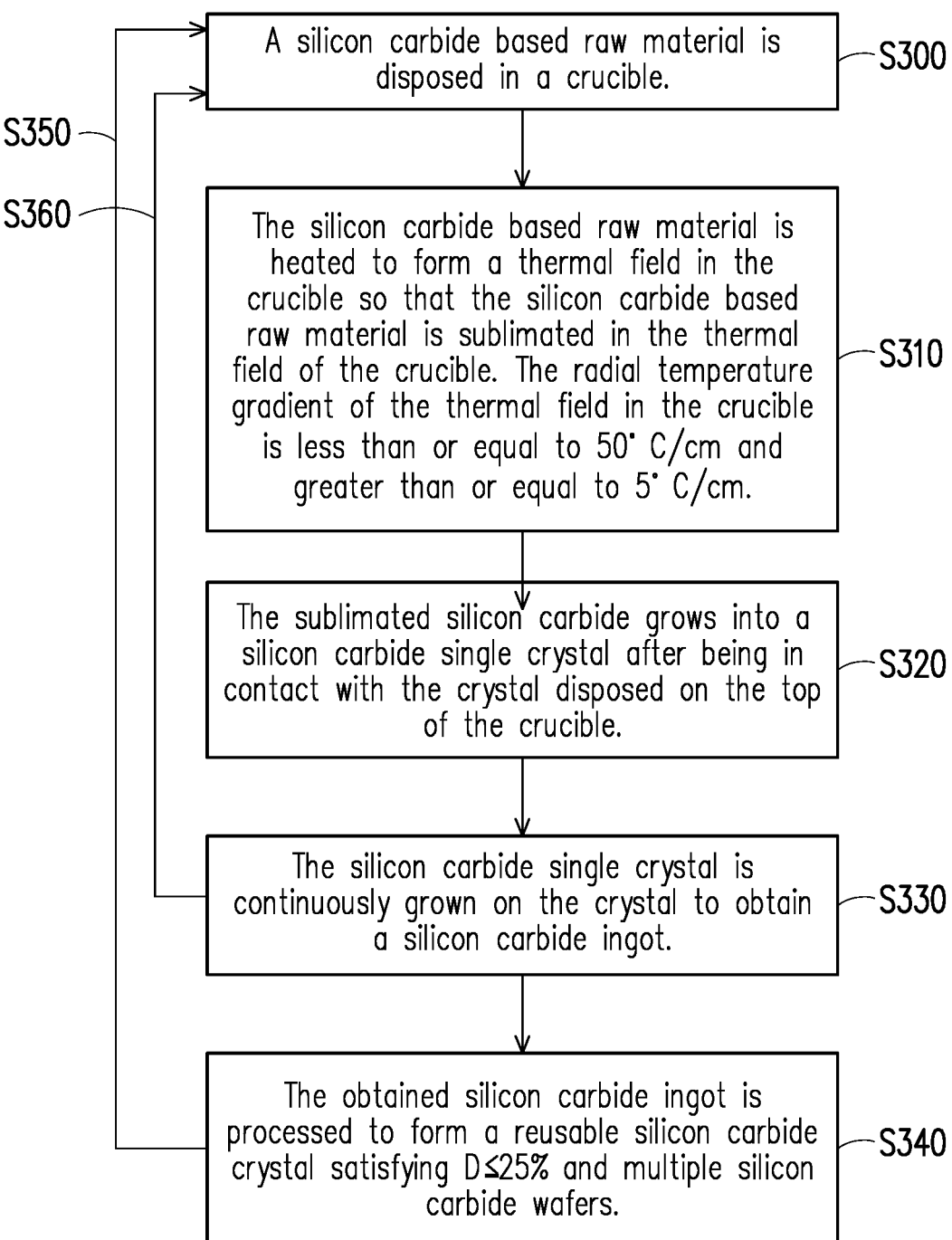

S350

S360

A silicon carbide based raw material is disposed in a crucible. ——S300

The silicon carbide based raw material is heated to form a thermal field in the crucible so that the silicon carbide based raw material is sublimated in the thermal field of the crucible. The radial temperature gradient of the thermal field in the crucible is less than or equal to 50° C/cm and greater than or equal to 5° C/cm. ——S310

The sublimated silicon carbide grows into a silicon carbide single crystal after being in contact with the crystal disposed on the top of the crucible. ——S320

The silicon carbide single crystal is continuously grown on the crystal to obtain a silicon carbide ingot. ——S330

The obtained silicon carbide ingot is processed to form a reusable silicon carbide crystal satisfying D≤25% and multiple silicon carbide wafers. ——S340

FIG. 4

METHOD OF MANUFACTURING SILICON CARBIDE SEED CRYSTAL AND METHOD OF MANUFACTURING SILICON CARBIDE INGOT

CROSS-REFERENCE TO RELATED APPLICATION

This application is a divisional application of and claims the benefit of a prior U.S. application Ser. No. 17/385,925, filed on Jul. 27, 2021, now pending. The prior U.S. application Ser. No. 17/385,925 claims the priority benefit of U.S. provisional application Ser. No. 63/056,728, filed on Jul. 27, 2020 and U.S. provisional application Ser. No. 63/056,729, filed on Jul. 27, 2020. The entirety of each of the above-mentioned patent applications is hereby incorporated by reference herein and made a part of this specification.

BACKGROUND

Technology Field

The disclosure relates to a semiconductor seed crystal and a method of manufacturing the same, and a method of manufacturing a semiconductor ingot, and particularly relates to a silicon carbide seed crystal and a manufacturing method thereof.

Description of Related Art

In the semiconductor industry, the method of manufacturing wafers includes first forming an ingot, and then slicing the ingot to obtain a wafer. The ingot is manufactured in a high-temperature environment, for example. In a common ingot manufacturing method, a seed crystal is disposed in a high-temperature furnace, the seed crystal is in contact with a gaseous or liquid raw material, and a semiconductor material is formed on the surface of the seed crystal until an ingot of the desired size is obtained. Ingots can have different crystal structures depending on the manufacturing method and manufacturing materials.

In the process of crystal growth, the quality of the seed crystal is a key factor affecting the quality of the grown crystal. For example, taking the silicon carbide crystal as an example, if the quality of the silicon carbide crystal is not good, many defects may accordingly occur due to different growth directions during the crystal growth process, and the yield is affected.

Moreover, seed crystals are an indispensable material when growing the silicon carbide ingot. However, in the prior art, after a silicon carbide seed crystal is used to grow silicon carbide ingots, the silicon carbide seed crystal cannot be reused because there are greater stress and more defects in and around the silicon carbide crystal, resulting in the increase of the manufacturing cost of crystal growth.

SUMMARY

The disclosure provides a silicon carbide seed crystal, and the basal plane dislocations (BPD) density difference of the two opposite surfaces is low, which allows a more consistent crystal growth direction and can reduce the structural defects of the silicon carbide ingots grown from the silicon carbide seed crystal. Moreover, the silicon carbide seed crystal can be reused, so the cost of silicon carbide growth is saved.

The disclosure also provides a method of manufacturing a silicon carbide crystal, which is used to form the silicon carbide seed crystal. Accordingly, after being processed, the formed seed crystals can be used as silicon carbide seed crystals in another silicon carbide ingot manufacturing process, so that the processed silicon carbide seed crystal can be reused, and the cost of crystal growth can be reduced.

The disclosure further provides a method of manufacturing silicon carbide ingots, which uses the silicon carbide seed crystals to grow high-quality silicon carbide ingots with fewer defects.

The silicon carbide seed crystal of the disclosure has a silicon surface and a carbon surface opposite to the silicon surface. A difference D between the basal plane dislocation density BPD1 of the silicon surface and the basal dislocation density BPD2 of the carbon surface satisfies formula (1) as follows:

$$D=(BPD1-BPD2)/BPD1 \leq 25\% \qquad (1).$$

In an embodiment of the disclosure, the basal plane dislocation density difference D between the silicon surface and the carbon surface is preferably 20% or less, more preferably 15% or less.

The disclosure provides a manufacturing method for forming the silicon carbide seed crystal, which includes steps as follows. A silicon carbide based raw material is disposed in a crucible. A silicon carbide seed crystal is disposed on a top of the crucible. The silicon carbide based raw material is heated to form a thermal field in the crucible so that the silicon carbide based raw material is sublimated in the thermal field of the crucible. A radial temperature gradient of the thermal field in the crucible is greater than or equal to 5° C./cm and less than or equal to 50° C./cm. A silicon carbide single crystal is grown from the sublimed silicon carbide after being in contact with the seed crystal disposed on the top of the crucible. The silicon carbide single crystal is grown on the seed crystal continuously to obtain silicon carbide ingots. The obtained silicon carbide ingots are processed to form a plurality of silicon carbide seed crystals. The plurality of silicon carbide seed crystals include the silicon carbide seed crystals satisfying D≤25%.

The disclosure provides a manufacturing method for forming the silicon carbide seed crystal, which includes steps as follows. A silicon carbide based raw material is disposed in a crucible. A silicon carbide seed crystal is disposed on a top of the crucible. The silicon carbide based raw material is heated to form a thermal field in the crucible so that the silicon carbide based raw material is sublimated in the thermal field of the crucible. A radial temperature gradient of the thermal field in the crucible is greater than or equal to 5° C./cm and less than or equal to 50° C./cm. A silicon carbide single crystal is grown from the sublimed silicon carbide after being in contact with the seed crystal disposed on the top of the crucible. The silicon carbide single crystal is grown on the seed crystal continuously to obtain silicon carbide ingots. The silicon carbide seed crystal located on the top of the crucible is a first seed crystal, the silicon carbide ingot obtained by the growth of the first seed crystal and processed to satisfy D≤25% is a second seed crystal, and a method of manufacturing the second seed crystal further includes steps as follows. The second seed crystal is disposed on a top of a crucible to grow a silicon carbide single crystal on the second seed crystal to grow an Nth silicon carbide ingot. The second seed crystal is reused to grow an N+1th silicon carbide ingot on the second seed crystal.

In an embodiment of the manufacturing method for forming the silicon carbide seed crystal of the disclosure, the method includes steps as follows. The second seed crystal is disposed on a top of a crucible. A silicon carbide based raw material is disposed in the crucible. The silicon carbide based raw material is heated so that the silicon carbide based raw material is sublimed in a thermal field of the crucible. A radial temperature gradient of the thermal field in the crucible is greater than or equal to 5° C./cm and less than or equal to 50° C./cm. A silicon carbide single crystal is grown from the sublimed silicon carbide after being in contact with the silicon carbide seed crystal. The silicon carbide single crystal is grown continuously on the silicon carbide seed crystal to obtain an N+1th silicon carbide ingot. In an embodiment, a basal plane dislocation density (BPD) of the unprocessed silicon carbide ingot is 300 EA/cm$^2$ or less, a stacking fault (SF) density is 10 EA/cm$^2$ or less, and a threading screw dislocation (TSD) density is 35 EA/cm$^2$ or less.

In an embodiment of the method of manufacturing silicon carbide ingots using the silicon carbide seed crystals of the disclosure, the method further includes processing the obtained silicon carbide ingot to form a reusable silicon carbide seed crystal and a plurality of silicon carbide wafers. In an embodiment, the processing includes cutting, grinding or polishing, and a basal plane dislocation density difference D between the silicon surface and the carbon surface of the processed silicon carbide reusable seed crystal is 25% or less. That is, the silicon carbide seed crystal of the disclosure can be formed, and the seed crystal can be reused in the crystal growth process.

Based on the above, the silicon carbide seed crystal of the disclosure allows a consistent seed crystal growth direction by controlling the basal plane dislocation density difference between the silicon surface and the carbon surface to produce high-quality silicon carbide ingots with fewer defects. The disclosure provides a method of manufacturing a silicon carbide seed crystal, and accordingly a silicon carbide seed crystal with a small basal plane dislocation density difference between the silicon surface and the carbon surface can be formed, and the seed crystal can be reused in the crystal growth process.

BRIEF DESCRIPTION OF THE DRAWINGS

FIG. 2 is a flow chart illustrating the preparation for a silicon carbide ingot according to an embodiment of the disclosure.

FIG. 4 is a flow chart illustrating the preparation for a silicon carbide ingot according to an embodiment of the disclosure.

DESCRIPTION OF THE EMBODIMENTS

Figure 1:
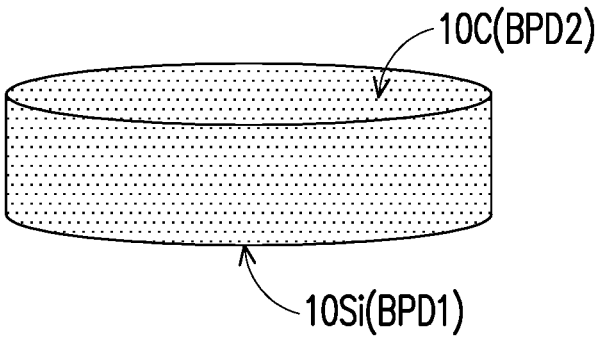
FIG. 1 is a schematic view of a silicon carbide ingot according to an embodiment of the disclosure.

The exemplary embodiments of the disclosure will be fully described below with reference to the drawings, but the disclosure may also be implemented in many different forms and should not be construed as being limited to the embodiments described herein. In the drawings, for clarity, a relative size, a thickness, and a location of each region, portion, and/or layer may not be necessarily drawn to scale.

Silicon Carbide Seed Crystal

FIG. 1 is a schematic view of a silicon carbide seed crystal according to an embodiment of the disclosure. As shown in FIG. 1, a silicon carbide seed crystal 10 has a silicon surface 10Si and a carbon surface 10C opposite to the silicon surface 10Si. Note that in the silicon carbide seed crystal 10 of the disclosure, a difference D between a basal plane dislocation density BPD1 of the silicon surface 10Si and a basal plane dislocation density BPD2 of the carbon surface 10C satisfies the following formula (1):

$$D=(BPD1-BPD2)/BPD1 \leq 25\% \tag{1}$$

The silicon carbide seed crystal 10 has the silicon surface 10Si and the carbon surface 10C opposite to the silicon surface 10Si. With the silicon carbide seed crystal 10 satisfying the formula (1) of the disclosure, the basal plane dislocation density difference D between the growth surface and the surface opposite to the growth surface is controlled within a specific range, and accordingly the ingots grown based on that are ensured to have low defects. Moreover, each of the multiple silicon carbide seed crystals 10 obtained from processing the ingots can be reused in the crystal growth process and serve as seed crystals in another silicon carbide ingot manufacturing process for growing new silicon carbide ingots in the subsequent process. The growth surface of the silicon carbide seed crystal of the disclosure can be the silicon surface 10Si or the carbon surface 10C; the processing process can include cutting, grinding, and polishing; the silicon carbide seed crystal 10 can be 6H silicon carbide or 4H silicon carbide; and the disclosure is not limited thereto.

Taking the carbon surface 10C as the growth surface as an example, in the disclosure, the relationship between the basal plane dislocation density BPD2 of the carbon surface 10C as the growth surface in the silicon carbide seed crystal 10 and the basal plane dislocation density BPD1 of the silicon surface 10Si which is the other side of the silicon carbide seed crystal 10 satisfies formula (1), so in ingot growth process, this can solve the defect problem resulting from the ingots growing in different directions due to the poor quality of the seed crystal during the crystal growth process, especially the problem of a higher density of defects around the seed crystal of the ingots obtained in the example. If there are many defects in the silicon carbide ingots, the silicon carbide wafers cut from the silicon carbide ingots may also have the defects and cannot be used as silicon carbide seed crystals 10. Taking the basal plane dislocation density as an example, the basal plane dislocation density of the obtained silicon carbide ingot may extend to the epitaxial layer, causing shockley-type stacking faults in various layers of the epitaxial layer, resulting in increased leakage current of the element, reducing the performance of the electronic element, and reducing the number of the yield of elements available. When the growth surface is the silicon surface 10Si, the growth mechanism and trend are the same as the above, which is not iterated herein. In the embodiment, for example, the thickness of the silicon carbide seed crystal 10 ranges from 8 mm to 50 mm, preferably 17 mm to 20 mm.

In the embodiment, for example, the detection of the basal plane dislocation density (BPD) can be analyzed with the following methods. The silicon carbide ingot is etched with KOH at 500° C., and then a measuring instrument such as automated optical inspection (AOI) instrument is used to calculate the number of BPD per unit area. The AOI instrument is a high-speed and high-precision optical image inspection system including applications such as measurement lens technology, optical lighting technology, positioning measurement technology, electronic circuit testing technology, image processing technology, automation technology, and the like. The AOI instrument uses machine vision as the testing standard technology. The measuring instrument uses optical instruments to obtain the surface condition of a finished product, and then computer image processing technology is used to detect defects such as foreign objects or abnormal patterns.

In the embodiment, the difference D between the basal plane dislocation density of the silicon surface 10Si and the basal plane dislocation density of the carbon surface 10C is 25% or less, preferably 20% or less, more preferably 15% or less, 10% or less, and most preferably 5% or less. In other embodiments, it may be 3% to 5%, 3% to 10%, 3% to 25%, 5% to 10%, 5% to 25%, and 10% to 25%. The basal plane dislocation density BPD1 of the silicon surface 10Si in the silicon carbide seed crystal 10 can range from 70 to 300 EA/cm², preferably 70 to 200 EA/cm². In other embodiments, it can range from 70 to 130 EA/cm², or 70 to 90 EA/cm². The basal plane dislocation density BPD2 of the carbon surface 10C in the silicon carbide seed crystal 10 can range from 70 to 300 EA/cm², preferably 70 to 170 EA/cm². In other embodiments, it may be 70 to 120 EA/cm², or 70 to 90 EA/cm², but the disclosure is not limited thereto.

In the embodiment, the processing process of the silicon carbide seed crystal 10 may include cutting, grinding, polishing, etching, and/or the like, and the disclosure is not limited thereto.

The manufacturing method for forming the silicon carbide seed crystal is illustrated in the following paragraphs.

The Manufacturing Method for Forming the Silicon Carbide Seed Crystal of a Silicon Carbide Ingot FIG. 2 is a flow chart illustrating the preparation for a silicon carbide ingot according to an embodiment of the disclosure.

Referring to FIG. 2, in step S200, a silicon carbide based raw material is disposed in a crucible. In step S210, the silicon carbide based raw material is heated to form a thermal field in the crucible, so that the silicon carbide based raw material is sublimated in the thermal field of the crucible. Note that the radial temperature gradient of the thermal field in the crucible is controlled to be less than or equal to 50° C./cm, and therefore the defects are prevented from being generated in the crystal growth process. If the radial temperature gradient of the thermal field in the crucible is above 50° C./cm, the basal dislocation density of the grown silicon carbide ingot may increase, causing too many defects in the grown silicon carbide ingots, resulting in poor quality of the subsequent processing and epitaxy process. Moreover, taking into account the process time, the radial temperature gradient of the thermal field in the crucible is limited to as low as preferably 5° C./cm or more. Furthermore, the radial temperature gradient of the thermal field in the crucible may be controlled to range from 5° C./cm to 30° C./cm or 5° C./cm to 25° C./cm in the subsequent process, but the disclosure is not limited thereto.

More specifically, referring to FIG. 2, when the radial temperature gradient of the thermal field in the crucible is controlled to be less than or equal to 50° C./cm, in step S220, the sublimated silicon carbide grows into a silicon carbide single crystal after being in contact with the seed crystal disposed on the top of the crucible. Next, in step S230, the silicon carbide single crystal is continuously grown on the seed crystal to obtain the silicon carbide ingot.

Next, in step S240, the obtained silicon carbide ingot is processed to form multiple silicon carbide seed crystals 10 as shown in FIG. 1, the difference D between the basal plane dislocation density of the silicon surface 10Si and the basal plane dislocation density of the carbon surface 10C of the silicon carbide seed crystal 10 is less than 25% or less. In the embodiment, the processing includes cutting the obtained silicon carbide ingot to form multiple silicon carbide seed crystals 10.

Therefore, according to the method of manufacturing the silicon carbide seed crystal of the disclosure, by controlling the radial temperature gradient of the thermal field in the crucible to be less than or equal to 50° C./cm, the difference between the basal plane dislocation density of the two opposing surfaces of the seed crystal obtained by cutting the silicon carbide ingot grown by the method can be 25% or less, that is, the difference between the basal plane dislocation density of the carbon surface and the silicon surface of the seed crystal.

Figure 3:
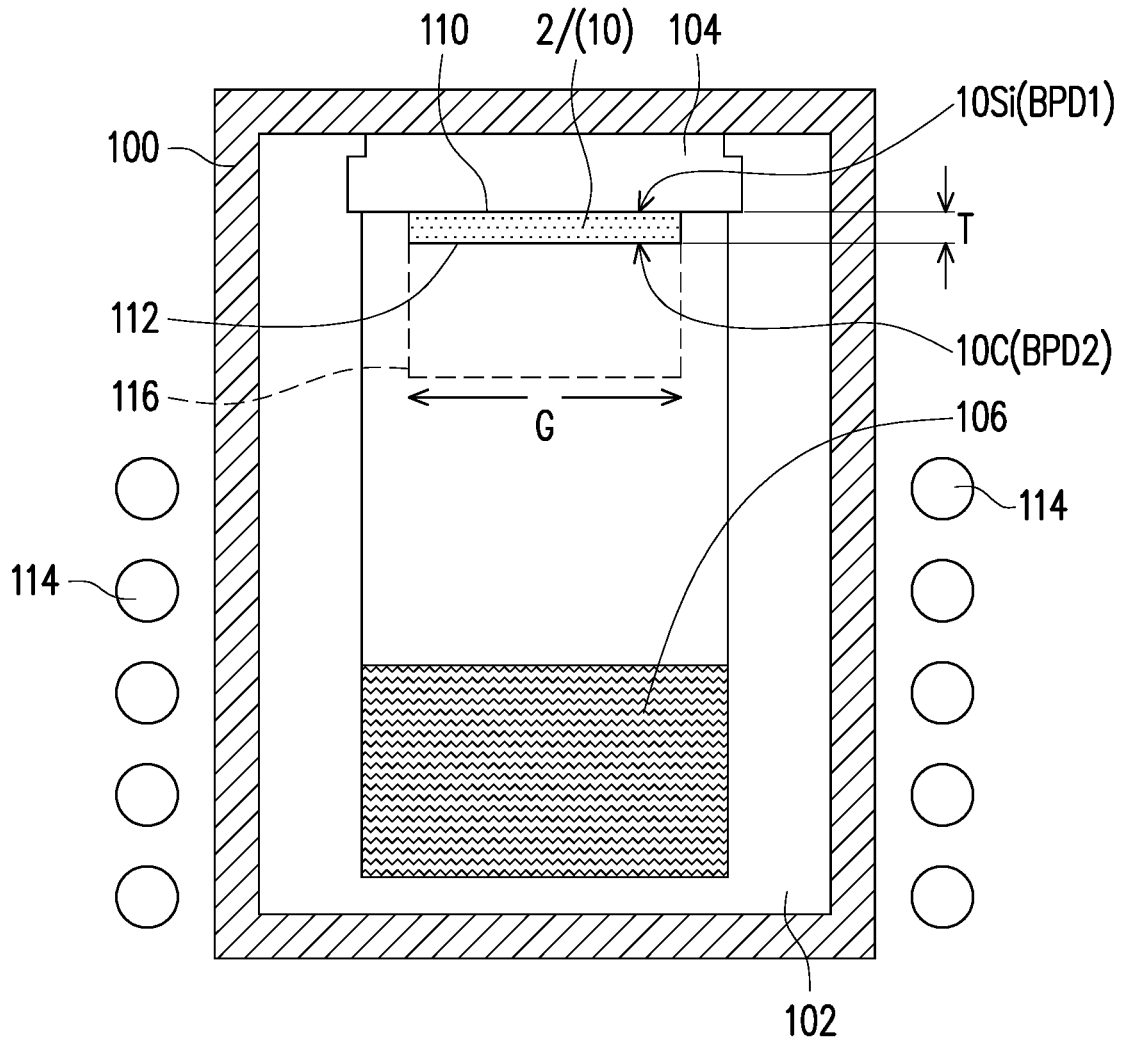
FIG. 3 is a schematic view of a silicon carbide ingot disposed in a physical vapor transport (PVT) device according to an embodiment of the disclosure.

FIG. 3 is a schematic view of a silicon carbide ingot disposed in a physical vapor transport (PVT) device according to an embodiment of the disclosure.

Referring to FIG. 3, in the embodiment, physical vapor transport (PVT) is an exemplary illustration and can be applied to all devices or manufacturing process that use PVT as a growth mechanism, and the disclosure is not limited to the PVT device shown in FIG. 2.

Generally, the PVT device has a furnace 100 including a graphite crucible 102 and a crystal carrier 104. A silicon carbide based raw material 106 is disposed at the bottom of the graphite crucible 102. Moreover, in the embodiment, in the implementation in which silicon carbide ingots are grown by reusable silicon carbide seed crystals, the silicon carbide seed crystals 10 are disposed on the crystal carrier 104. In the embodiment, the surface of the carbon surface 10C of the silicon carbide seed crystal 10 facing the silicon carbide based raw material 106 is served as a growth surface 112. In the implementation of manufacturing silicon carbide seed crystals in other embodiments, the silicon carbide seed crystal 10 can also be redisposed by an original seed crystal 2, and the disclosure is not limited thereto. An induction coil 114 is further disposed outside the graphite crucible 102 for heating the silicon carbide based raw material 106 in the graphite crucible 102.

In FIG. 3, the difference D between the basal plane dislocation density BPD1 of the silicon surface 10Si and the basal plane dislocation density BPD2 of the carbon surface 10C of the silicon carbide seed crystal 10 is less than or equal to 25%, and the silicon carbide seed crystal 10 can be processed by using the silicon carbide ingots of the disclosure after being processed. Referring to FIG. 3, when the induction coil 114 heats the silicon carbide based raw material 106 at the bottom of the graphite crucible 102 to a high temperature, the silicon carbide based raw material 106 may be decomposed and directly sublimated without being through a liquid phase. Driven by the temperature gradient G, the silicon carbide based raw material 106 is transmitted to the low-temperature growth surface 112 of the silicon carbide seed crystal 10 to form nucleation and growth, and finally a silicon carbide ingot 116 is grown and obtained.

Note that in the manufacturing method of the silicon carbide seed crystal 10 of the disclosure, as shown in FIG. 3, the radial temperature gradient G of the thermal field in the crucible 102 is less than or equal to 50° C./cm. By controlling the radial temperature gradient G of the thermal field in the crucible 102, the silicon carbide ingot 116 grown in the growth surface 112 of the silicon carbide seed crystal 10 is processed to form the silicon carbide seed crystal, and the difference D between the basal dislocation density of the two opposite surfaces of the silicon carbide seed crystal is less than or equal to 25%, which is used as the silicon carbide seed crystal 10 of FIG. 1. The processing process includes cutting, grinding, polishing, and the like, and the disclosure is not limited thereto.

The Method of Manufacturing Silicon Carbide Ingots by Using the Reusable Silicon Carbide Seed Crystals FIG. 4 is a flow chart illustrating the preparation for a silicon carbide ingot according to an embodiment of the disclosure. In the embodiment, the physical vapor transport device shown in FIG. 3 can be used to perform the steps shown in FIG. 4.

Referring to FIG. 3 and FIG. 4, in step S300, a silicon carbide seed crystal 10 with the difference D of 25% or less is disposed on the top of the crucible 102, and the silicon carbide based raw material 106 is disposed in the crucible 102. Next, in step S310, the silicon carbide based raw material 106 is heated, so that the silicon carbide based raw material 106 is sublimated in the thermal field of the crucible 102. Note that the radial temperature gradient G of the thermal field in the crucible is controlled to be greater than or equal to 5° C./cm and less than or equal to 50° C./cm, so the defects generated in the crystal growth process can be prevented, but the disclosure is not limited thereto, and the conditions of processing different crystal growth can be adjusted according to different requirements.

More specifically, referring to FIG. 3 and FIG. 4, in step S320, the sublimated silicon carbide grows into a silicon carbide single crystal after being in contact with the silicon carbide seed crystal 10. Then, in step S330, the silicon carbide single crystal is continuously grown on the silicon carbide seed crystal 10 to obtain the silicon carbide ingot 116. Therefore, according to the manufacturing method of the silicon carbide ingot using the silicon carbide seed crystal 10 as shown in FIG. 1 of the disclosure, a high-quality silicon carbide ingot 116 with fewer defects can be grown. Specifically, the basal dislocation density of the grown silicon carbide ingot 116 before processing is 300 EA/cm² or less, a stacking fault (SF) density thereof is 10 EA/cm² or less, and a threading screw dislocation (TSD) density thereof is 35 EA/cm² or less.

Moreover, as shown in FIG. 4, the manufacturing method of the silicon carbide ingot using the silicon carbide seed crystal 10 of the FIG. 1 of the disclosure may further include step S340. In step 340, the obtained silicon carbide ingot 116 may be further processed to obtain the silicon carbide seed crystal 10 with the difference D satisfying 25% or less and multiple silicon carbide wafers, and the silicon carbide seed crystal 10 with the difference D satisfying 25% or less can be reused as the original seed crystal for another batch of silicon carbide ingots. For example, as shown in step S300 to step S340 in FIG. 4, the silicon carbide seed crystal on the top of the crucible where the silicon carbide ingot is grown for the first time is set as the first seed crystal, and the silicon carbide ingot obtained by growing the first seed crystal and after being processed, the silicon carbide ingot satisfying D≤25% is set as the second seed crystal. The second seed crystal can be used repeatedly, so as step S350 shown in FIG. 4, the second seed crystal is disposed on the top of the crucible to grow the silicon carbide single crystal on the second seed crystal to grow the Nth silicon carbide ingot. Moreover, after N silicon carbide ingots are grown, the same second seed crystal can be reused in step S360 in FIG. 4 to grow the N+1th silicon carbide ingot on the reused second seed crystal. The processing process includes cutting, grinding or polishing, which is not iterated herein. Moreover, the difference D of the basal plane dislocation density between the silicon surface 10Si and the carbon surface 10C of the processed silicon carbide seed crystal 10 can be less than 25% or less. Due to the excellent growth quality, the processed silicon carbide seed crystal 10 can be reused in another crystal growth process without causing waste of raw materials.

Re-Use of the Silicon Carbide Seed Crystal 10

FIG. 5A to FIG. 5D are schematic views of using a silicon carbide seed crystal and a manufacturing method thereof, and a manufacturing method of a silicon carbide ingot according to an embodiment of the disclosure.

Figure 5A:
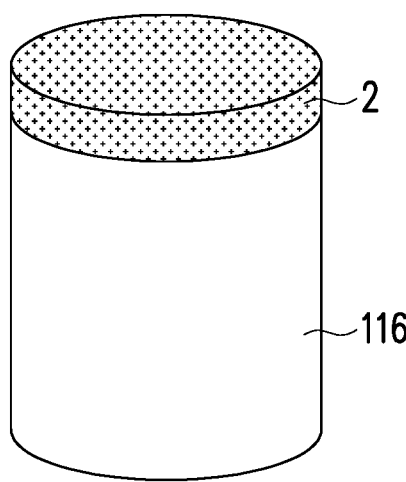
FIG. 5A to FIG. 5C are schematic views of using a silicon carbide seed crystal and a manufacturing method thereof, and a manufacturing method of a silicon carbide ingot according to an embodiment of the disclosure.

Referring to FIG. 5A, for example, the silicon carbide seed crystal 10 of the disclosure can be processed in the physical vapor transport (PVT) device of FIG. 3 by using the method of manufacturing the silicon carbide seed crystal in FIG. 2. Specifically, referring to FIG. 5A, for example, the silicon carbide ingot 116 (also referred to as the ingot in the table of preparation examples) can be grown from the original silicon carbide seed crystal 2 (also referred to as the first seed crystal in the disclosure).

Figure 5B:
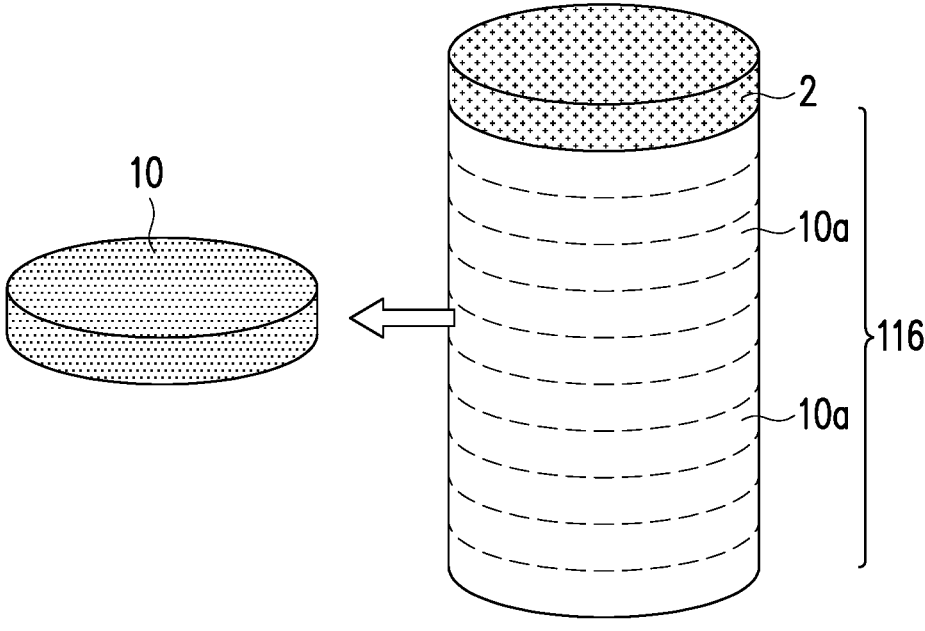

Next, referring to FIG. 5B, the grown silicon carbide ingot 116 can be sliced to form multiple silicon carbide wafers 10*a*. Moreover, as shown by the arrow in FIG. 5B, the difference D between the basal plane dislocation density of the silicon surface 10Si and the carbon surface 10C of at least one of the silicon carbide wafers 10*a* is tested to be less than or equal to 25%, so the at least one of the silicon carbide wafers 10*a* can be used repeatedly as the silicon carbide seed crystal 10 (also referred to as the second seed crystal in the disclosure) of the disclosure.

Figure 5C:
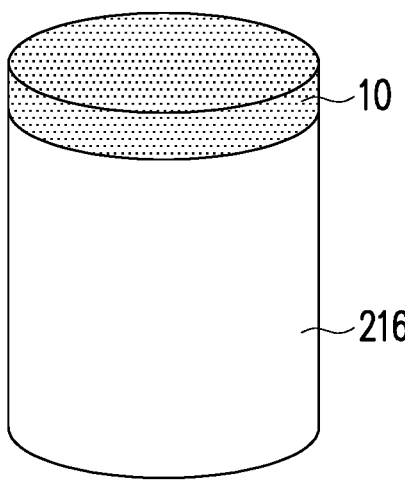
Figure 5D:
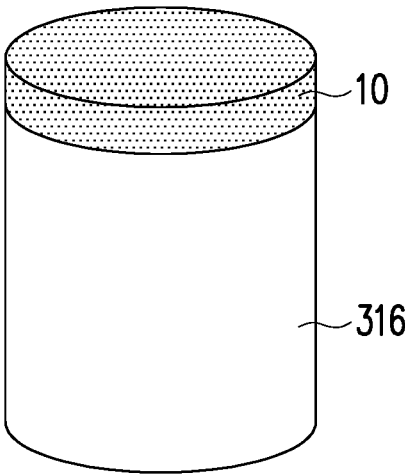
FIG. 5D is a schematic view of a manufacturing method of another batch of silicon carbide ingots processed by repeatedly using the silicon carbide seed crystal according to the embodiment of the disclosure shown in FIG. 5C.

Moreover, as shown in FIG. 5C, since the silicon carbide seed crystal 10 obtained as the second seed crystal satisfies formula (1) and has low defect characteristics, the silicon carbide seed crystal 10 can be reused. Specifically, referring to step S360 of FIG. 3 and FIG. 4 and FIG. 5C, the silicon carbide seed crystal 10 obtained from processing the silicon carbide ingot 116 is disposed again in the physical vapor transport device of FIG. 3 to grow another silicon carbide ingot 216. Moreover, referring to FIG. 3 and FIG. 4, step S310 to step S340 and FIG. 5D are repeated. After the silicon carbide ingot 216 is manufactured, the silicon carbide seed crystals 10 can be reused again to grow another batch of silicon carbide ingot 316. In this way, by repeating the manufacturing steps, the silicon carbide seed crystal 10 (second seed crystal) of the disclosure can not only produce the Nth batch of Nth silicon carbide ingots 216 but also can be used to produce the N+1th batch of N+1th silicon carbide ingots 316, the disclosure does not limit the value of N.

Based on the above, the silicon carbide seed crystal 10 of the disclosure can control the basal plane dislocation density difference between the silicon surface 10Si and the carbon surface 10C, so that the crystal growth direction can be consistent, and high-quality silicon carbide ingots with fewer defects can be produced. Moreover, by using the manufacturing method of silicon carbide seed crystal 10 of the disclosure, high-quality silicon carbide ingots with fewer defects can be manufactured, and the obtained silicon carbide seed crystal 10 after being processed can be reused to reduce the cost of silicon carbide growth.

Several experiments are illustrated below to verify the efficacy of the disclosure, but the experimental content is not intended to limit the scope of the disclosure.

Preparation Example 1-9

In the device shown in FIG. 3, a silicon carbide based raw material is disposed in a crucible, and the silicon carbide based raw material is heated. The temperature gradient is adjusted to form thermal fields with different radial temperature gradients in the crucible. As shown in Table 1 below, the temperature gradient of Comparative Examples 1-3 is greater than 50° C./cm, and the temperature gradient of Examples 1-6 is less than or equal to 50° C./cm. In Example 1 of Table 1 below, a thermal field with a radial temperature gradient of 15° C./cm is formed in the crucible. Next, the silicon carbide based raw material is sublimated in the thermal field of the crucible. Then, the sublimated silicon carbide is in contact with the original seed crystal 2 (or the reusable silicon carbide seed crystal 10) disposed on the top of the crucible to grow a silicon carbide single crystal on the seed crystal. The silicon carbide single crystal is continuously grown on the original seed crystal 2/or the reusable etched with KOH at 500° C., and then a measuring instrument such as automated optical inspection (AOI) instrument is used to calculate the BPD density of the silicon surface 10Si and the carbon surface 10C of the silicon carbide seed crystal 10 per unit area. The results are shown in Table 1.

Polishing Conditions

The silicon carbide wafer is processed by chemical mechanical polishing (CMP) to form the silicon carbide seed crystal 10. The pressure during CMP is greater than 15 g/cm², the polishing speed is not less than 15 rpm, and the time is about 0.5 hour.

The Base Dislocation Density (BPD) of the Seed Crystal

The basal plane dislocation density is measured for the grown silicon carbide ingot, and the measured results are shown in Table 1 below. The basal plane dislocation density BPD evaluation of the seed crystal is as follows:

The basal plane dislocation density BPD of the seed crystal measured to be greater than 300 EA/cm² is evaluated as NG, which represents poor quality, and the value less than or equal to 300 EA/cm² is evaluated as G, which represents good quality.

TABLE 1

| Preparation | Comparative examples | | | Embodiments | | | | | |
|---|---|---|---|---|---|---|---|---|---|
| Examples | 1 | 2 | 3 | 1 | 2 | 3 | 4 | 5 | 6 |
| Seed Crystal BPD 1 (EA/cm²) | 1403 | 1353 | 1295 | 118 | 285 | 213 | 158 | 86 | 79 |
| Seed Crystal BPD 2 (EA/cm²) | 1105 | 976 | 998 | 109 | 229 | 172 | 141 | 82 | 76 |
| D | 26.97% | 38.63% | 29.76% | 8.26% | 24.45% | 23.84% | 12.06% | 4.88% | 3.95% |
| temperature gradient (50° C./cm) | 65 | 85 | 70 | 15 | 25 | 30 | 50 | 5 | 10 |
| ingot SF density (EA/cm²) | 25 | 22 | 23 | 6 | 8 | 10 | 9 | 3 | 5 |
| Ingot BPD density (EA/cm²) | 1451 | 1958 | 1898 | 95 | 203 | 156 | 102 | 76 | 71 |
| Ingot TSD density (EA/cm²) | 198 | 153 | 185 | 30 | 25 | 31 | 30 | 23 | 26 |
| Evaluation | NG | NG | NG | G | G | G | G | G | G | silicon carbide seed crystal 10 to obtain silicon carbide ingots. The obtained silicon carbide ingots are cut to form multiple silicon carbide wafers and satisfy the D of 25% or less. For example, in the first embodiment, at least one reusable silicon carbide seed crystal with a D of 8%. Silicon carbide ingots 216 and 316 can be repeatedly manufactured by using silicon carbide seed crystals 10 that satisfy D of 25% or less as shown in FIG. 5C and FIG. 5D.

Analysis of Seed Crystal Defects

Basal Plane Dislocation (BPD) density analysis: the silicon carbide ingot is cut into multiple wafers, the wafers are As the silicon carbide seed crystals shown in comparative examples 1 to 3 in Table 1, when the seed crystal with the basal plane dislocation density difference D between the silicon surface and the carbon surface greater than 25% is used to grow silicon carbide ingots, the quality of the silicon carbide ingots processed is not good, which cannot be used to grow silicon carbide seed crystals that can be reused in the next batch. In contrast, as the silicon carbide seed crystals shown in Examples 1 to 6 in Table 1, when the seed crystal with the basal plane dislocation density difference D between the silicon surface and the carbon surface less than or equal to 25% is used to grow silicon carbide ingots, the quality of the silicon carbide ingots is good, and silicon carbide seed crystals processed from the silicon carbide ingots can be reused, thereby reducing the cost of silicon carbide growth. Moreover, according to the comparison between the quality of silicon carbide ingots grown from the silicon carbide seed crystals of Examples 1 to 6 and that of silicon carbide ingots grown from the silicon carbide seed crystals of Comparative Examples 1 to 3, when the temperature gradient is less than or equal to 50° C./cm, the seed crystal growth process is more stable and there are fewer defects. However, if the temperature gradient is less than 5° C./cm, seed crystals cannot be grown. Moreover, if the temperature gradient is too low, it takes long time to process crystals, and the temperature gradient may preferably be greater than or equal to 5° C./cm. On the contrary, if the temperature gradient is too high, the crystal growth may be fast, which may cause more defects in the grown silicon carbide ingots, which may affect the crystal quality and the yield of the subsequent processing process. Therefore, the temperature gradient should preferably be less than or equal to 50° C./cm.

In summary, since the silicon carbide seed crystal of the disclosure has the basal plane dislocation density difference D between the growth surface and the opposite surface less than or equal to 25%, the silicon carbide ingot grown from the silicon carbide seed crystal has a basal dislocation density BPD less than $300/cm^2$, or preferably a basal dislocation density BPD less than $900/cm^2$, and thus the quality of the film layer formed by subsequent epitaxy is ensured. Moreover, by using the silicon carbide seed crystals of the disclosure to grow seed crystals, the grown silicon carbide ingots can be used again as silicon carbide seed crystals due to their low defect characteristics after processing, thereby reducing the cost of crystal growth.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A method of manufacturing silicon carbide seed crystals, comprising:

disposing a silicon carbide based raw material in a crucible;

disposing a silicon carbide seed crystal on a top of the crucible;

heating the silicon carbide based raw material to form a thermal field in the crucible so that the silicon carbide based raw material is sublimated in the thermal field of the crucible, wherein a radial temperature gradient of the thermal field in the crucible is greater than or equal to 5° C./cm and less than or equal to 50° C./cm;

growing a silicon carbide single crystal from the sublimed silicon carbide after being in contact with the seed crystal disposed on the top of the crucible; and growing the silicon carbide single crystal on the seed crystal continuously to obtain a silicon carbide ingot silicon carbide ingot;

wherein the silicon carbide seed crystal located on the top of the crucible is a first seed crystal, the silicon carbide ingot obtained by the growth of the first seed crystal and processed to satisfy D≤25% is a second seed crystal, wherein the second seed crystal comprises a silicon surface and a carbon surface opposite to the silicon surface, a difference D between a basal plane dislocation density BPD1 of the silicon surface and a basal plane dislocation density BPD2 of the carbon surface satisfies a formula (1) as follows:

$$D=(BPD1-BPD2)/BPD1 \leq 25\% \qquad (1); \text{ and}$$

wherein the method further comprises:

disposing the second seed crystal on a top of a crucible to grow a silicon carbide single crystal on the second seed crystal to grow an Nth silicon carbide ingot; and reusing the same second seed crystal to grow an N+1th silicon carbide ingot on the second seed crystal, wherein growing the N+1th silicon carbide ingot comprises:

disposing the reused second seed crystal on a top of a crucible;

disposing a silicon carbide based raw material in the crucible;

heating the silicon carbide based raw material so that the silicon carbide based raw material is sublimed in a thermal field of the crucible, wherein a radial temperature gradient of the thermal field in the crucible is greater than or equal to 5° C./cm and less than or equal to 50° C./cm;

growing a silicon carbide single crystal from the sublimed silicon carbide after being in contact with the silicon carbide seed crystal; and growing the silicon carbide single crystal continuously on the silicon carbide seed crystal to obtain an N+1th silicon carbide ingot.

2. The method of manufacturing the silicon carbide ingot of claim 1, further comprising:

processing the obtained silicon carbide ingot to form a reusable silicon carbide seed crystal and a plurality of silicon carbide wafers.

3. The method of manufacturing the silicon carbide ingot of claim 2, the processing comprises cutting, grinding or polishing.

4. The method of manufacturing the silicon carbide ingot of claim 1, a basal plane dislocation density BPD of the unprocessed silicon carbide ingot is 300 $EA/cm^2$ or less, a stacking fault (SF) density is 10 $EA/cm^2$ or less, and a threading screw dislocation (TSD) density is 35 $EA/cm^2$ or less.

* * * * *